BROADBAND NEGATIVE RESISTANCE DEVICE

Filed Dec. 14, 1965

Inventor:
Paul G. Ingerson
By Merriam, Marshall, Shapiro, & Klose
Attys.

3,457,528

BROADBAND NEGATIVE RESISTANCE DEVICE

Paul G. Ingerson, Oak Lawn, Ill., assignor to University of Illinois Foundation, Urbana, Ill., a corporation of Illinois Filed Dec. 14, 1965, Ser. No. 513,781
Int. Cl. H01p 1/24; H03f 3/60
U.S. Cl. 333—80 10 Claims

ABSTRACT OF THE DISCLOSURE

A broadband negative resistance device having a plurality of tuned loading elements each including a negative resistance element and periodically located along a transmission line with either the element spacings or resonant frequencies or both substantially related in a substantially log periodic manner.

This invention is related to negative resistance devices and more particularly to apparatus for providing a substantially constant negative resistance over a wide band width.

Prior art methods utilized a tunnel diode which is a semi-conductor element exhibiting a negative resistance characteristic from D.C. to frequencies in the kilomegacycle region. Typical techniques for attempting to obtain a constant negative resistance device have involved the use of the tunnel diode and passive tuning circuits to resonate out the inherent shunt capacitance of the tunnel diode. These techniques are limited however to providing a nearly constant negative resistance over a very narrow band width determined by the figure of merit of the diode.

In accordance with the present invention, a plurality of tuned loading elements each including a negative resistance element are periodically located along the transmission line such that the effect is to produce an approximately continuously scaled or pseudo-frequency independent transmission line. By suitable choice of the spacings of the loading elements on the transmission line, and of the design parameters of the loading elements, such apparatus can present a substantially constant negative resistance over a band width primarily determined by the frequency range of the combination of tuned loading circuits. For example, with a first tuned loading circuit at one end of a transmission line tuned to 200 mc., followed by a number of intermediate tuned circuits appropriately positioned along the line, including a final tuned circuit at the other end of the transmission line tuned to, for instance 800 mc., the band of operation will be slightly narrower than the frequency range between the initial and the final tuned elements.

The invention will be better understood from the following detailed description thereof taken in conjunction with the accompanying drawings in which.

Figure 1:
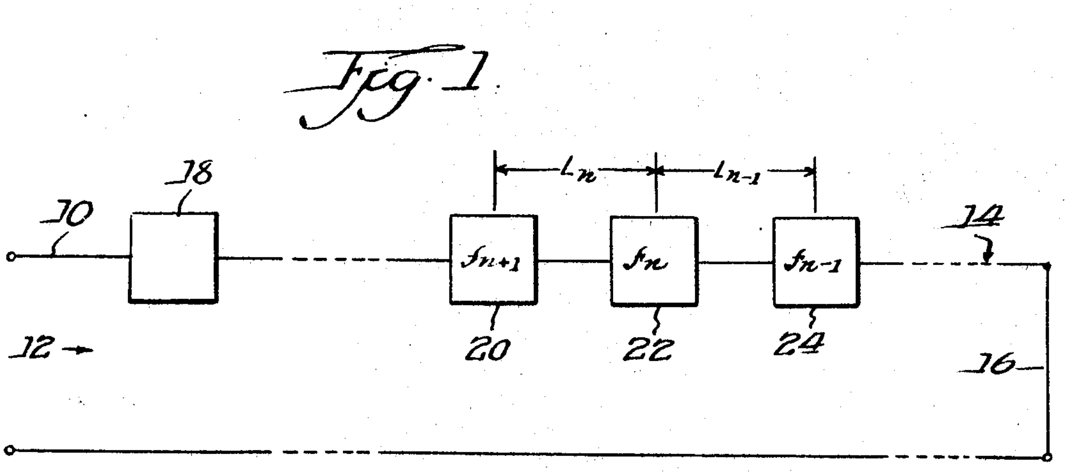
FIGURE 1 is a schematic diagram illustrating a plurality of tuned loading elements periodically spaced along a transmission line in accordance with the principles of the present invention.

Referring now to FIGURE 1 there is illustrated a device for presenting a nearly constant negative resistance over a broad band of frequencies, with the device including a transmission line 10 for propagating electromagnetic energy and having a first port 12 at one end of the transmission line for coupling energy to and from the line. The other end 14 of the transmission line 10 can be terminated in an open or a short circuited configuration since the termination has no appreciable significance within the desired operating band of frequencies. For convenience, the transmission line end 14 has been illustrated in FIGURE 1 as being terminated in an RF short circuiting member 16. It must be understood that a transmission line 10 can be any of the well known apparatus for propagating electromagnetic energy, that is, coaxial lines, wave guide, strip transmission line, and others.

Coupled to the transmission line, from the input port 12 to the transmission line end 14, is a plurality of tuned loading elements designated as 18, 20, 22 and 24. Each of the tuned loading elements includes a negative resistance element providing a negative resistance characteristic at a predetermined frequency, and each of the loading elements is periodically located along the transmission line 10 so that the device shown in FIGURE 1 will present a nearly constant negative resistance over a wide operating band of frequencies at the input port 12. A wider band width can be realized by merely enlarging or increasing the number of tuned loading elements on the transmission line.

In order to illustrate the principles of the present invention, particular reference may now be made to a selected group of tuned loading elements on the transmission line 10, this group of loading elements being designated with the reference numerals 20, 22 and 24. The tuned loading element 20 is spaced from the loading element 22 by a length of transmission line equal to $L_n$; and similarly the loading element 22 is spaced from the element 24 by a length of transmission line equal to $L_{n-1}$. The spacings of these elements are related by a scaling factor $\tau_1$, where $$\tau_1=\frac{L_n}{L_{n-1}}$$

and where $\tau_1$ is less than or equal to 1. Thus, it may be noted that the spacing between adjacent loading elements varies in a geometric or logarithmic manner such that the length of transmission lines between the loading elements decreases from the input port 12 at one end of the transmission line to the transmission line end 14.

As mentioned previously the series of loading elements each present a negative resistance characteristic at a different frequency. As illustrated in FIGURE 1, the tuned loading element 22 is constructed so as to resonate at a first frequency $f_n$ and the next succeeding loading element 24 resonates at a frequency $f_{n-1}$. The loading element resonant frequencies are related in a geometric manner, that is, the resonant frequency of the next succeeding loading element in proceeding from the input port 12 towards the transmission line end 14 is determined by multiplying the resonant frequency of the preceding loading element by a constant scale factor. Mathematically this may be expressed as $$\tau_2=\frac{f_n}{f_{n-1}}$$

where $\tau_2$ is a constant scaling factor.

It will be appreciated that in the preferred embodiment of the present invention, the construction of the device as shown in FIGURE 1 is based on a log-periodic approximation to a continuously scaled transmission line. That is, when $\tau_1$ is equal to $\tau_2$, the sealing is log-periodic and a nearly constant negative resistance is obtained over the widest bandwidth. However, special note may be made that while log-periodic scaling is to be desired for operations over an arbitrarily wide bandwidth, this is not a necessary condition, since many of the benefits of the log-periodic scaling are maintained even if $\tau_1$ and $\tau_2$ have different values or even if a uniform rather than a log-periodic scaling is used. Admittedly, the performance of such a device is inferior to that in which log-periodic scaling is maintained. Yet, for many practical applications, satisfactorily maintained negative resistance values over smaller band widths can still be maintained with other types of scalings of the loading elements rather than a log-periodic scaling thereof.

Figure 2:
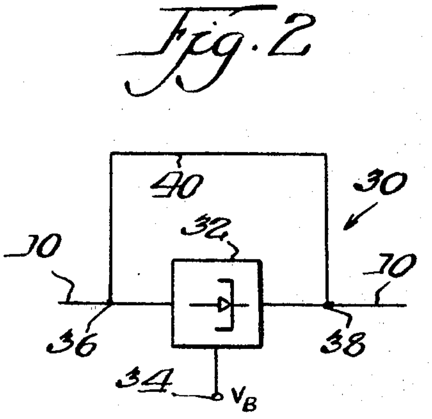
FIGURE 2 is a schematic diagram illustrating one embodiment of the present invention utilizing a tunnel diode biased in the negative resistance region and a shorted section of transmission line as the loading element illustrated in FIGURE 1.

Referring now to FIGURE 2 there is illustrated a tuned loading element 30 which illustrates a preferred embodiment of the present invention. The loading element 30 includes a tunnel diode 32 which is a well known semiconductor device exhibiting a negative resistance characteristic from D.C. to frequencies in the kilomegacycle region. The tunnel diode is a readily available semiconductor element having a current versus voltage operating characteristic curve such that between the values of two applied voltages the current through the tunnel diode decreases with increasing values of voltage. Thus, by applying a bias voltage at an optimum voltage point within this negative resistance region, (such as the bias voltage $V_b$ applied to bias terminal 34 as shown in FIGURE 2) the tunnel diode will present a value of negative resistance at the tunnel diode terminals 36 and 38 which is determined by the value of the bias voltage.

Figure 3:
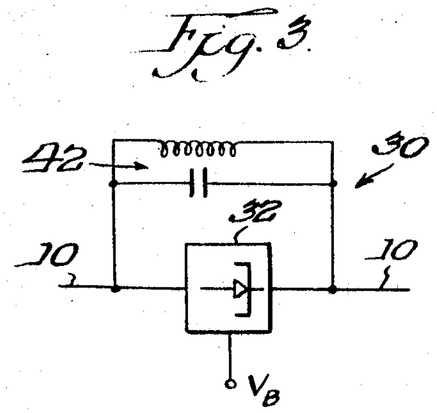
FIGURE 3 is a schematic illustration of an equivalent tuned tank circuit for the embodiment shown in FIGURE 2.

As illustrated in FIGURE 2, the tunnel diode 32 is coupled to the transmission line 10. In order to resonate the tunnel diode 32 at the desired frequency, an RF shorted section of transmission line 40 is coupled across the tunnel diode 32. For purposes of setting the tuned loading element 30 at the desired frequency the shorted section 40 can be adjustable so that the resonant frequency can be varied. It is understood of course that the shorted section 40 can be any apparatus compatible with the type of transimission line 10 utilized. For instance, in a coaxial line arrangement the shorted section 40 can be an appropriate tuning stub. Similarly, in instances where the tunnel diode 32 is coupled to a transmission line 10 consisting of a wave guide arrangement the shorted section 40 will consist of a coresponding form of tuning apparatus. In FIGURE 3 there is shown a schematic illustration of an equivalent circuit of the embodiment shown in FIGURE 2. The tunnel diode 32 is effectively tuned by a tank circuit 42 such that the loading element 30 will resonate at the desired scale frequency. Thus, it can be seen that the loading elements include a negative resistance element providing a negative resistance characteristic and a tuning element whose function is to resonate a negative resistance element at the desired scale frequency. FIGURE 2 illustrates a preferred embodiment of the invention which includes a tunnel diode as the negative resistance element and a shorted section of line 40 forming the tuning element.

Figure 4:
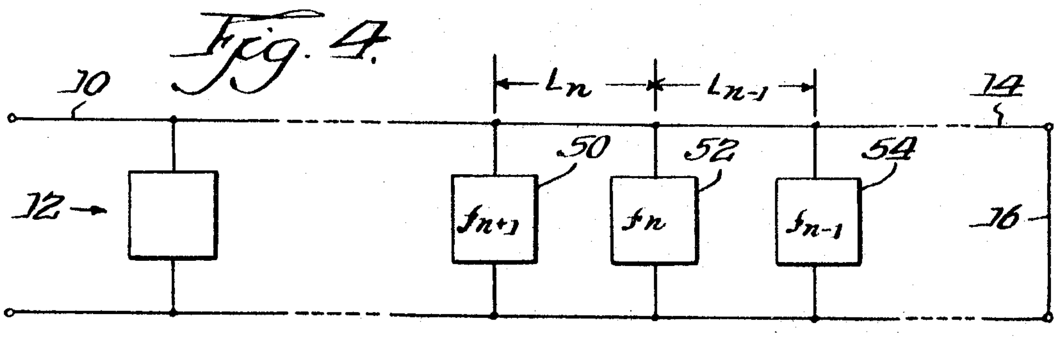
FIGURE 4 is an alternative embodiment illustrating the tuned loading elements in a shunt configuration on the transmission line.

The illustration of the principles of the invention shown in FIGURES 1–3 disclose a series loaded configuration in which the loading elements are serially located along the transmission lines and in which each of the loading elements includes in effect a shunt resonating circuit. Referring to FIGURE 4 there is illustrated an alternative embodiment illustrating a shunt loaded configuration in which a number of tuned loading elements 50, 52 and 54 are shunt loaded across the transmission line 10, and wherein each of the tuned loading elements includes in effect a series resonating circuit. The manner of determining the resonating frequency of each of the loading elements 50–54 and of the spacing between the loading elements on the transmission line is determined in a manner similar to that described in connection with FIGURE 1.

As an example of a device constructed in accordance with the teachings herein, a series of 5–TD1A tunnel diodes were coupled together in a slab coaxial configuration and in which the spacing of the diodes was related by $\tau_1$ equal to 0.65. The tuning element consisted of a coaxial stub with the frequency scale factor $\tau_2$ equal to 0.65 to provide a log-periodic scaling. As was expected, the necessity of providing the first few diodes at one end of the line and the last few diodes at the other end of the transmission line in order to enable the device to truncate or drop off in response so as to define an operating band width, determined a reduction in the basic properties of the device so that a nearly constant voltage standing wave ratio on the transmission line at the input port (which is an indication of the variation in impedance level as viewed from the input port) was obtained over a frequency range of 2 to 1. Although when using only five elements the truncation effect at the high and low end of the operating band is pronounced and limits the operating band width, the constructed device fully demonstrates the teachings of this invention. Further, by including for instance eight loading elements, with a loading element or two on either side of the desired frequency range to produce the desired input impedance, it can be readily determined that an approximately 5 or 6 to 1 operating band width of frequencies wherein the voltage standing wave ratio is held sufficiently constant can be obtained.

Thus, it can be seen that the device as presented herein can provide a wide band negative impedance at its input terminal. Such a device is particularly useful when employed in amplifiers, negative resistance oscillators, and other device utilizing negative resistance characteristics.

The foregoing detailed description has been given for clearness of understanding only, and no unnecessary limitations should be understood therefrom, as modifications will be obvious to those skilled in the art.

What is claimed is:

1. A broadband negative resistive device comprising:

a length of transmission line;

a plurality of loading elements for operation at predetermined frequencies, said loading elements periodically spaced along and coupled to said transmission line;

each including a negative resistance element providing negative resistance characteristics at a corresponding one of said predetermined frequencies;

each of said loading elements resonant at a corresponding one of said predetermined frequencies to present a negative resistance characteristic on said transmission line over a range of frequencies determined by the combined resonant frequencies of said loading elements; and said periodic spacings and the relative resonant frequencies of the loading elements are substantially related in a log periodic manner to provide substantially constant negative resistance over a broadband of operating frequencies.

2. A device as claimed in claim 1 wherein each of said loading elements includes a tuning element for resonating a corresponding negative resistance element at a corresponding one of said predetermined frequencies.

3. A device as claimed in claim 1 wherein said negative resistance element includes a tunnel diode.

4. A device as claimed in claim 1 wherein said loading elements are serially coupled to said transmission line.

5. A device as claimed in claim 1 wherein said transmission line includes a combined input and output port for respectively coupling energy to and from said transmission line.

6. A device as claimed in claim 1 wherein the periodic spacing of said loading elements are substantially related by $$\tau = \frac{L_n}{L_{n-1}}$$

said $L_n$ being a length of transmission line between a first loading element and an immediately preceding second loading element along one end of said transmission line, and said $L_{n-1}$ being the length of transmission line between said first loading element and an immediately following loading element along the other end of said transmission line, and wherein said loading element resonant frequencies are substantially related by $$\tau_2=\frac{f_n}{f_{n-1}}$$

wherein $f_n$ is the resonant frequency of a first loading element, and $f_{n-1}$ is the resonant frequency of an immediately following loading element.

7. A device as claimed in claim 6 wherein $\tau_1=\tau_2$, whereby the periodic spacings and the relative resonant frequencies of said loading elements are related in a log periodic manner so as to provide a substantially constant negative resistance characteristic over a wide band of operating frequencies.

8. A device as claimed in claim 7 wherein said negative resistance element includes a tunnel diode.

9. A broadband negative resistance device comprising:
a length of transmission line;
a plurality of loading elements for operation at perdetermined frequencies, said loading elements periodically spaced along and coupled to said transmission line;
each including a negative resistance element providing negative resistance characteristics at a corresponding one of said predetermined frequencies;
each of said loading elements resonant at a corresponding one of said predetermined frequencies to present a negative resistance characteristic on said transmission line over a range of frequencies determined by the combined resonant frequencies of said loading elements; and
said periodic spacings of the loading elements substantially related in a log periodic manner to provide substantially constant negative resistance over a broadband of operating frequencies.

10. A broadband negative resistance device comprising:
a length of transmission line;
a plurality of loading elements for operation at perdetermined frequencies, said loading elements periodically spaced along and coupled to said transmission line;
each including a negative resistance element providing negative resistance characteristics at a corresponding one of said predetermined frequencies;
each of said loading elements resonant at a corresponding one of said predetermined frequencies to present a negative resistance characteristic on said transmission line over a range of frequencies determined by the combined resonant frequencies of said loading elements; and
said relative resonant frequencies of the loading element substantially related in a log periodic manner to provide substantially constant negative resistance over a broadband of operating frequencies.

References Cited

UNITED STATES PATENTS

| | | | |
|---|---|---|---|
| 3,255,421 | 6/1966 | Skalski | 330—34 |
| 3,187,266 | 6/1965 | Marshall | 330—34 |
| 3,040,267 | 6/1962 | Seidel | 330—56 |
| 2,522,395 | 9/1950 | Ohl | |
| 1,987,440 | 1/1935 | Habann. | |
| 2,522,402 | 9/1950 | Robertson. | |

HERMAN K. SAALBACH, Primary Examiner

C. BARAFF, Assistant Examiner

U.S. Cl. X.R.

179—170; 330—34, 56, 61; 333—73